(12) United States Patent
Terai et al.

(10) Patent No.: US 9,178,074 B2
(45) Date of Patent: Nov. 3, 2015

(54) SEMICONDUCTOR DEVICE, DISPLAY UNIT, AND ELECTRONIC APPARATUS

(71) Applicant: Joled Inc., Tokyo (JP)

(72) Inventors: Yasuhiro Terai, Kanagawa (JP); Takahide Ishii, Kanagawa (JP); Ayumu Sato, Tokyo (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/202,852

(22) Filed: Mar. 10, 2014

(65) Prior Publication Data

US 2014/0291639 A1 Oct. 2, 2014

(30) Foreign Application Priority Data

Mar. 27, 2013 (JP) ................................. 2013-066219

(51) Int. Cl.
*H01L 27/00* (2006.01)
*H01L 29/786* (2006.01)
*H01L 27/12* (2006.01)
*H01L 27/32* (2006.01)
*H01L 27/13* (2006.01)

(52) U.S. Cl.
CPC ........ *H01L 29/7869* (2013.01); *H01L 27/1214* (2013.01); *H01L 27/1225* (2013.01); *H01L 27/1255* (2013.01); *H01L 27/13* (2013.01); *H01L 27/3262* (2013.01); *H01L 27/3265* (2013.01); *H01L 27/3244* (2013.01)

(58) Field of Classification Search
CPC ............ H01L 27/1214; H01L 27/1255; H01L 27/3262; H01L 27/3265; H01L 27/13
See application file for complete search history.

(56) References Cited

U.S. PATENT DOCUMENTS

| 8,628,987 | B2 * | 1/2014 | Yamazaki | 438/30 |
|---|---|---|---|---|
| 2010/0084650 | A1 * | 4/2010 | Yamazaki et al. | 257/43 |
| 2010/0084653 | A1 * | 4/2010 | Yamazaki et al. | 257/43 |
| 2010/0102314 | A1 * | 4/2010 | Miyairi et al. | 257/43 |
| 2010/0163874 | A1 * | 7/2010 | Koyama et al. | 257/57 |
| 2010/0252826 | A1 * | 10/2010 | Yamazaki et al. | 257/43 |
| 2010/0301326 | A1 * | 12/2010 | Miyairi et al. | 257/43 |
| 2011/0084267 | A1 * | 4/2011 | Yamazaki et al. | 257/43 |
| 2011/0309362 | A1 * | 12/2011 | Yoon et al. | 257/59 |
| 2012/0062814 | A1 * | 3/2012 | Yamazaki et al. | 349/43 |
| 2012/0146004 | A1 * | 6/2012 | Lee et al. | 257/40 |
| 2012/0188478 | A1 * | 7/2012 | Kuwabara | 349/43 |
| 2013/0023086 | A1 * | 1/2013 | Chikama et al. | 438/104 |
| 2013/0056741 | A1 * | 3/2013 | Harumoto et al. | 257/59 |
| 2013/0092923 | A1 * | 4/2013 | Hara et al. | 257/43 |
| 2014/0113395 | A1 * | 4/2014 | Kim et al. | 438/34 |
| 2014/0131666 | A1 * | 5/2014 | Song et al. | 257/40 |
| 2014/0377905 | A1 * | 12/2014 | Ning et al. | 438/104 |
| 2015/0001484 | A1 * | 1/2015 | Choi et al. | 257/40 |

FOREIGN PATENT DOCUMENTS

| JP | 2010-166030 | 7/2010 |
|---|---|---|
| JP | 2010-222214 | 10/2010 |
| JP | 2011-091279 | 5/2011 |
| JP | 2011-100091 | 5/2011 |

* cited by examiner

*Primary Examiner* — Ngan Ngo
(74) *Attorney, Agent, or Firm* — K&L Gates LLP

(57) ABSTRACT

Provided is a semiconductor device that includes: a transistor; an oxide semiconductor film; a first conductive film electrically connected to the oxide semiconductor film; and a first insulating film provided between the first conductive film and the oxide semiconductor film.

10 Claims, 14 Drawing Sheets

SEMICONDUCTOR DEVICE, DISPLAY UNIT, AND ELECTRONIC APPARATUS

CROSS REFERENCES TO RELATED APPLICATIONS

The present application claims priority to Japanese Priority Patent Application JP 2013-066219 filed in the Japan Patent Office on Mar. 27, 2013, the entire content of which is hereby incorporated by reference.

BACKGROUND

The present application relates to a semiconductor device having an oxide semiconductor film, to a display unit, and to an electronic apparatus.

An oxide containing elements such as zinc (Zn) and indium (In) exerts an excellent property as an active layer of a semiconductor device, and is recently being developed for applications to TFT, a light-emitting device, and a transparent conductive film. In particular, it has been known that an electron mobility of TFT using a composite oxide containing elements such as Zn, In, and Ga is large as compared to that of the TFT using amorphous silicon (a-Si:H) generally used for a liquid crystal display, and an excellent electrical characteristic is exerted.

In the TFT (Thin Film Transistor) using such an oxide semiconductor, a bottom-gate type TFT and a top-gate type TFT have been reported up to now. The bottom-gate type TFT has a configuration in which a thin-film layer of the oxide semiconductor is provided on a gate electrode with a gate insulating film provided therebetween. This structure is similar a structure of the TFT, which is commercialized at the present, in which amorphous silicon is used for a channel. Therefore, it is possible to divert an existing manufacturing process of the TFT using amorphous silicon thereto easily, and the bottom-gate type structure is often used in the TFT using an oxide semiconductor.

As described above, an oxide semiconductor material is used as a channel film of the TFT. On the other hand, a method for improving electrical conductivity of the oxide semiconductor material and applying it to an electrode of a capacitor has also been studied (for example, see Japanese Unexamined Patent Application Publication No. 2011-100091). In the oxide semiconductor material, carriers are generated due to oxygen defects. That is, a reduction process is applied to the oxide semiconductor material, and thereby it is possible to improve electrical conductivity thereof. Examples of the reduction process include an argon process, an annealing process under a nitrogen ($N_2$) atmosphere, and a hydrogen process (for example, see Japanese Unexamined Patent Application Publication Nos. 2010-166030, 2010-222214, and 2011-091279). The hydrogen process may be, for example, hydrogen plasma irradiation.

SUMMARY

However, in a manufacturing process of a device, also after the reduction process is applied to an oxide semiconductor material, various processes such as an oxidation process are applied thereto. Therefore, it is difficult to maintain electrical conductivity of the oxide semiconductor material in a stable manner.

It is desirable to provide a semiconductor device including an oxide semiconductor film having stable electrical conductivity, a display unit, and an electronic apparatus.

A semiconductor device according to an embodiment of the present application includes: a transistor; an oxide semiconductor film; a first conductive film electrically connected to the oxide semiconductor film; and a first insulating film provided between the first conductive film and the oxide semiconductor film.

In the semiconductor device according to the above-described embodiment of the present application, a carrier generation amount in the oxide semiconductor film is controlled by the first conductive film connected to the oxide semiconductor film.

A display unit according to an embodiment of the present application includes: a display layer; and a semiconductor device configured to drive the display layer. The semiconductor device includes a transistor, an oxide semiconductor film, a first conductive film electrically connected to the oxide semiconductor film, and a first insulating film provided between the first conductive film and the oxide semiconductor film.

An electronic apparatus according to an embodiment of the present application is provided with a display unit. The display unit is provided with a display layer and a semiconductor device configured to drive the display layer. The semiconductor device includes: a transistor; an oxide semiconductor film; a first conductive film electrically connected to the oxide semiconductor film; and a first insulating film provided between the first conductive film and the oxide semiconductor film.

In the semiconductor device, the display unit, and the electronic apparatus according to the above-described respective embodiments of the present application, the carrier generation amount in the oxide semiconductor film is controlled by the first conductive film. Therefore, it is possible to maintain electrical conductivity of the oxide semiconductor film in a stable manner.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

Hereinafter, some embodiments of the present application are described in detail with reference to the accompanying drawings. The description will be given in the following order.

1. First Embodiment (Example in which an oxide semiconductor film and a first conductive film configure one of electrodes of a capacitor)

2. Second Embodiment (Example in which an oxide semiconductor film and a first conductive film configure one of a pair of electrodes that interposes a display layer in between)

First Embodiment

Figure 1:
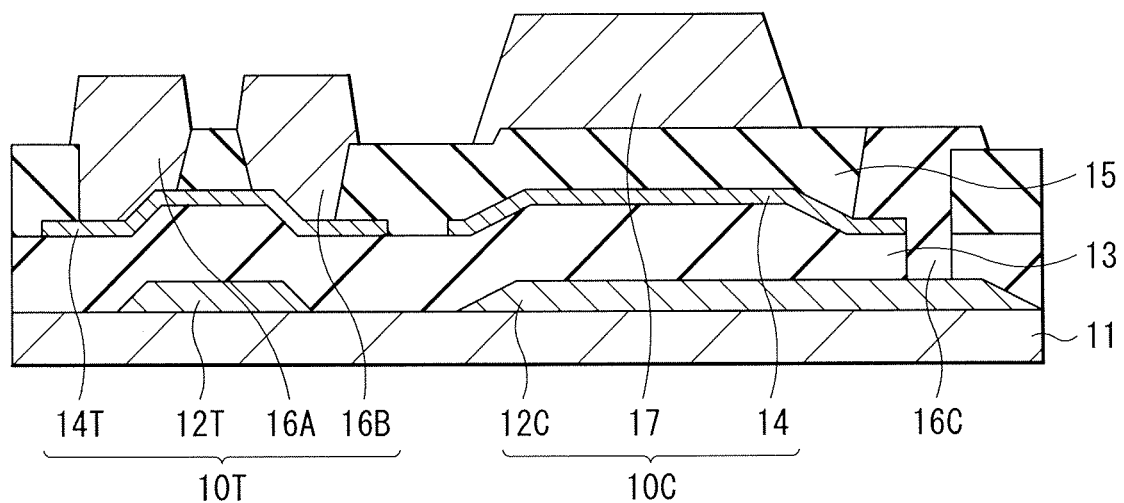
FIG. 1 is a cross-sectional view illustrating a configuration of a major part of a semiconductor device according to a first embodiment of the present application.
Figure 2:
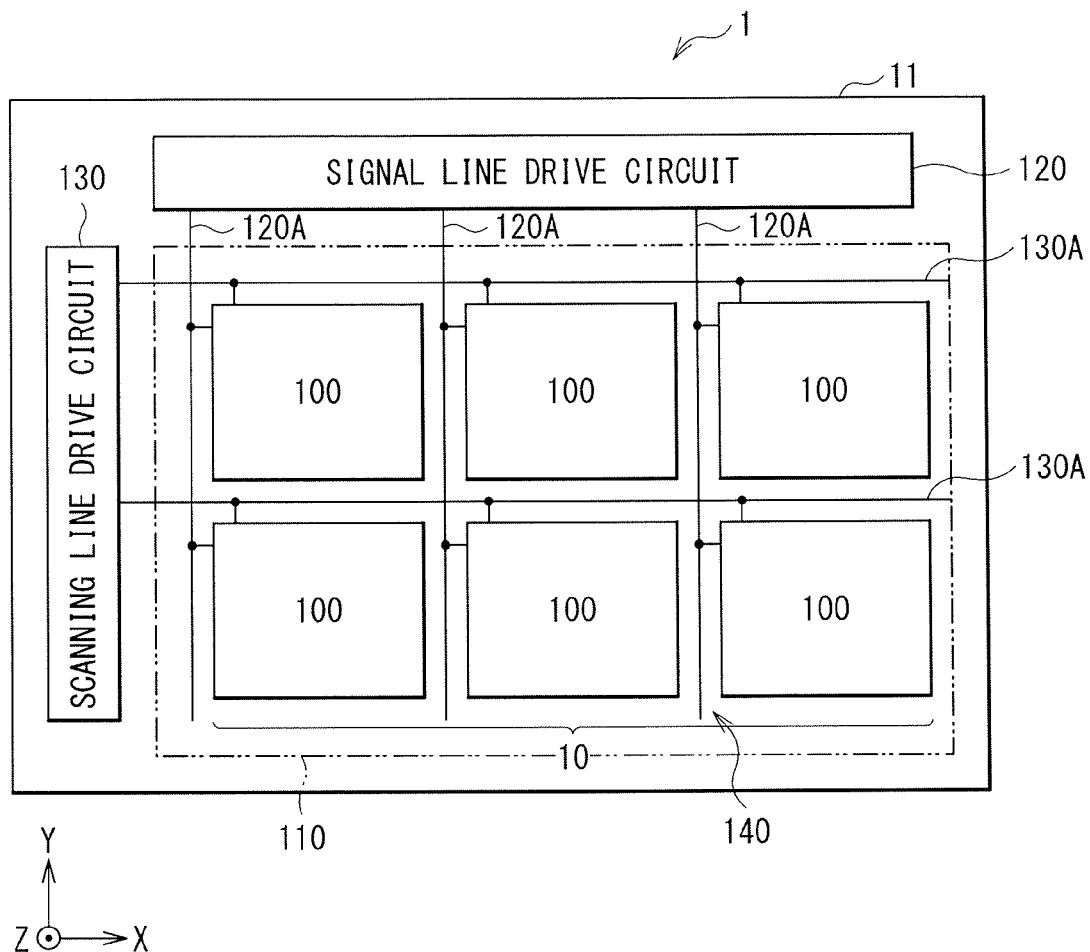
FIG. 2 illustrates one example of an overall configuration of a display unit having the semiconductor device illustrated in FIG. 1.

FIG. 1 illustrates a cross-sectional configuration of a semiconductor device (semiconductor device 10) according to a first embodiment. The semiconductor device 10 has a transistor 10T and a capacitor 10C at positions adjacent to each other on a substrate 11, and may be applied to, for example, a display unit 1 as illustrated in FIG. 2.

The display unit 1 includes a display layer such as a liquid crystal layer or an organic EL (Electroluminescence) layer, and the display layer is driven by the semiconductor device 10 on a pixel 100 basis. In a display region 110, the pixels 100 are two-dimensionally arranged in a matrix form, and a pixel drive circuit 140 for driving the pixels 100 is provided. In the pixel drive circuit 140, a plurality of signal lines 120A (120A1, 120A2, . . . , 120Am, . . . ) are arranged in a column direction (Y direction), and a plurality of scanning lines 130A (130A1, 130A2, . . . , 130An, . . . ) are arranged in a row direction (X direction). Further, one of the pixels 100 is provided at each intersection of the signal line 120A and the scanning line 130A. Both ends of the signal line 120A are connected to the signal line drive circuit 120, and both ends of the scanning line 130A are connected to the scanning line drive circuit 130.

The signal line drive circuit 120 supplies a signal voltage of an image signal corresponding to luminescence data supplied from a signal supply source (not illustrated) to the pixel 100 selected through the signal line 120A. The scanning line drive circuit 130 includes a shift register that sequentially shifts (transfers) a start pulse in synchronization with an input clock pulse. The scanning line drive circuit 130 performs scanning of the pixels 100 on a row basis at the time of writing the image signal in each of the pixels 100, and sequentially supplies a scanning signal to each of the scanning lines 130A. A signal voltage from the signal line drive circuit 120 is supplied to the signal line 120A, and a scanning signal from the scanning line drive circuit 130 is supplied to the scanning line 130A.

Figure 3:
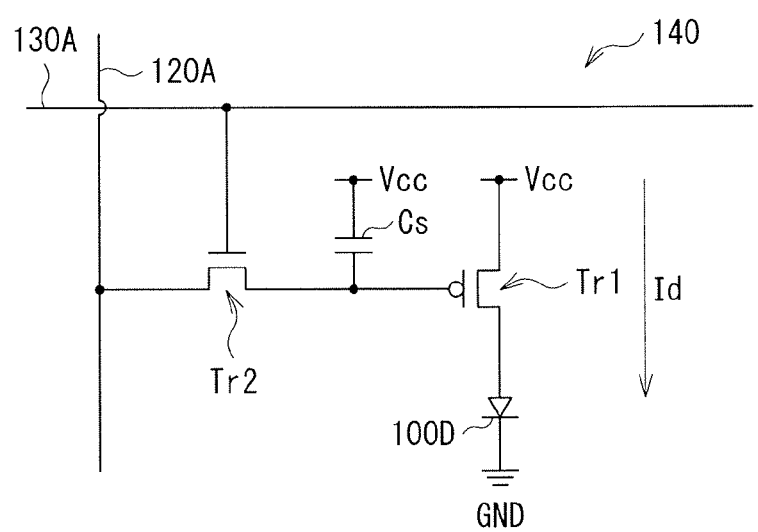
FIG. 3 illustrates one example of a pixel drive circuit illustrated in FIG. 2.

FIG. 3 illustrates one configuration example of the pixel drive circuit 140. The semiconductor device 10 may configure, for example, the pixel drive circuit 140. The pixel drive circuit 140 is an active type drive circuit having a driving transistor Tr1, a writing transistor Tr2, a capacitor (capacitor 10C) provided therebetween, and a display element 100D such as an organic EL element. The display element 100D is connected in series to the driving transistor Tr1. The driving transistor Tr1 or the writing transistor Tr2 or both are configured by the transistor 10T of the semiconductor device 10.

[Configuration of Major Part of Semiconductor Device]

Referring again to FIG. 1, a detailed configuration of the semiconductor device 10 is described below.

The transistor 10T is a bottom-gate type (inverted-staggered type) thin-film transistor in which a gate electrode 12T, a channel film 14T, and source-drain electrodes 16A and 16B are arranged in this order from the substrate 11 side. The first insulating film 13 is provided between the gate electrode 12T and the channel film 14T, and a part of an upper region of the channel film 14T is covered with a second insulating film 15.

The substrate 11 may be configured by a glass substrate or a plastic film. Examples of the plastic material may include PET (polyethylene terephthalate) and PEN (polyethylene naphthalate). When formation the semiconductor layer 14 is possible without heating the substrate 11, such as by using a sputtering method, an inexpensive plastic film may be used for the substrate 11.

The gate electrode 12T serves to apply a gate voltage to the transistor 10T and control a carrier density in the channel film 14T by the gate voltage. The gate electrode 12T may be provided in a selective region on the substrate 11 at a thickness in a range from 100 nm to 500 nm, for example. The gate electrode 12T may include a metal simple substance such as platinum (Pt), titanium (Ti), ruthenium (Ru), molybdenum (Mo), copper (Cu), tungsten (W), nickel (Ni), aluminum (Al), and tantalum (Ta), or an alloy thereof. Alternatively, the gate electrode 12T may be configured by a transparent conductive thin-film such as an indium tin oxide (ITO), an indium zinc oxide (IZO), and a zinc oxide (ZnO).

The first insulating film 13 may have a thickness in a range from 100 nm to 500 nm, for example, and functions as a gate insulating film. The first insulating film 13 may be configured, for example, by an insulating film including one or more of a silicon oxide film, a silicon nitride film, a silicon oxynitride film, a hafnium oxide film, an aluminum oxide film, an aluminum nitride film, a tantalum oxide film, a zirconium oxide film, a hafnium oxynitride film, a hafnium silicon oxynitride film, an aluminum oxynitride film, a tantalum oxynitride film, and a zirconium oxynitride film. The first insulating film 13 may have a single layer structure, or a laminated structure of two or more types. In the case where the first insulating film 13 has the laminated structure of two or more types, an interface characteristic with respect to the channel film 14T is improved and entering of impurities to the channel film 14T from the outside air is suppressed.

The channel film 14T is provided on the first insulating film 13 in an island shape, and a channel region is formed at a position facing the gate electrode 12T between the source-drain electrodes 16A and 16B. For example, the channel film 14T may be configured by an oxide semiconductor containing, as a main component, an oxide of one or more elements of indium (In), gallium (Ga), zinc (Zn), tin (Sn), zirconium (Zr), aluminum (Al), and titanium (Ti). Specifically, the channel film 14T may be configured by a transparent oxide semiconductor containing a zinc oxide as a main component, such as an indium gallium zinc oxide (IGZO), a zinc oxide, an aluminum-doped zinc oxide (AZO), or a gallium-doped zinc oxide (GZO). In consideration of an oxygen supply efficiency in an annealing step during a manufacturing process, a thickness of the channel film 14T may be preferably in a range from 5 nm to 100 nm, for example. Although the channel film 14T may be either in an amorphous state or in a crystalline state, resistance to an etching solution is increased and easier application to a device structure formation is possible when the channel film 14T has the crystalline state.

The second insulating film 15 is provided on a channel region of the channel film 14T, and serves to prevent a damage of the channel film 14T during the formation of the source-drain electrodes 16A and 16B. The second insulating film 15 may be configured by, for example, a silicon oxide film, a silicon nitride film, or an aluminum oxide film having a thickness in a range from 50 nm to 400 nm. A plurality of kinds of insulating films may be laminated to configure the second insulating film 15.

The source-drain electrodes 16A and 16B are provided on the channel film 14T, and are electrically connected to the channel film 14T. The source-drain electrodes 16A and 16B each may include, for example, a single layer film of a metal film made of molybdenum, aluminum, copper, titanium, ITO, or an alloy thereof, or a laminated film of two or more kinds of metal films thereof. It is possible to hold an electrical characteristic of the semiconductor film 14 in a stable manner when the source-drain electrodes 16A and 16B each include a three-layer film. Such a three-layer film may have a lamination of films in order of a molybdenum film, an aluminum film, and a molybdenum film which may be 50 nm, 500 nm, and 50 nm in thickness, respectively. Further, the source-drain electrodes 16A and 16B each may have a configuration in which a metal film containing oxygen such ITO or a titanium oxide is in contact with the channel film 14T besides molybdenum. When the channel film 14T made of an oxide semiconductor material is in contact with a metal film that easily pulls out oxygen, oxygen of the oxide semiconductor is pulled out, causing formation of a defect. Accordingly, when the metal film containing oxygen is used for a region in contact with the channel film 14T out of the source-drain electrodes 16A and 16B, it is possible to make an electrical characteristic of the transistor 10T stable.

The capacitor 10C has a first conductive film 12C, a semiconductor film 14C (oxide semiconductor film), and a second conductive film 15 in this order from the substrate 11 side. The first insulating film 13 and the second insulating film 15 are shared by the transistor 10T and the capacitor 10C. The first insulating film 13 extends between the first conductive film 12C and the semiconductor film 14C, and the second insulating film 15 extends between the semiconductor film 14C and the second conductive film 17. In the present embodiment, a wiring 16C for electrically connecting the first conductive film 12C to the semiconductor film 14C is provided. That is, the semiconductor film 14C and the first conductive film 12C have the same potential as one another. As will be described later in detail, this makes it possible to control a carrier generation amount in the semiconductor film 14C through the first conductive film 12C, thereby making it possible to maintain electrical conductivity of the semiconductor film 14C in a stable manner.

The first conductive film 12C and the semiconductor film 14C that are electrically connected to each other function as a lower electrode (one of electrodes) of the capacitor 10C. For example, the first conductive film 12C is arranged in the same layer as the gate electrode 12T, and the semiconductor film 14C is arranged in the same layer as the channel film 14T. A metal material same as that of the gate electrode 12T may be used for the first conductive film 12C, and an oxide semiconductor material same as that of the channel film 14T may be used for the semiconductor film 14C. However, the first conductive film 12C may differ from the gate electrode 12T in constituent material, and the semiconductor film 14C may differ from the channel film 14T in constituent material.

The wiring 16C is in contact with the semiconductor film 14C and covers, for example, a region from an upper surface to an end surface thereof. Further, the wiring 16C penetrates the first insulating film 13 to reach the first conductive film 12C. The second conductive film 17 is an upper electrode (the other electrode) of the capacitor 10C. The second insulating film 15 between the second conductive film 17 and the semiconductor film 14C serves as a capacitor insulating film. As described above, in the capacitor 10C, it is possible to use an insulating film (second insulating film 15) which is different from the gate insulating film (first insulating film 13) of the transistor 10T for the capacitor insulating film. For the wiring 16C and the second conductive film 17, although the same conducting materials as those of the source-drain electrodes 16A and 16B may be used, constituent materials thereof may be different from one another.

The above semiconductor device 10 may be, for example, manufactured as follows (FIGS. 4A to 4D).

Figure 4A:
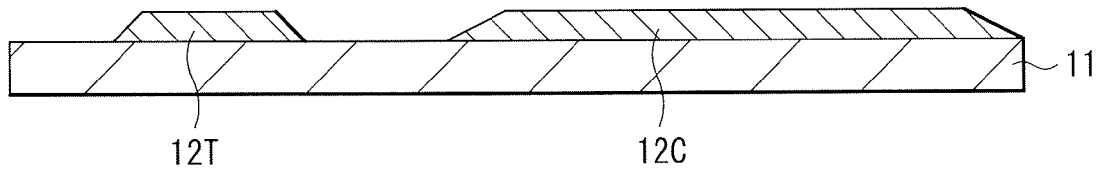
FIG. 4A is a cross-sectional view illustrating a manufacturing process of the semiconductor device illustrated in FIG. 1.

First, by using a sputtering method or a CVD (Chemical Vapor Deposition) method, for example, a metal thin film is formed over an entire surface of the substrate 11. Then, the metal thin film is patterned by using a photolithography method and an etching method to form the gate electrode 12T and the first conductive film 12C (FIG. 4A).

Figure 4B:
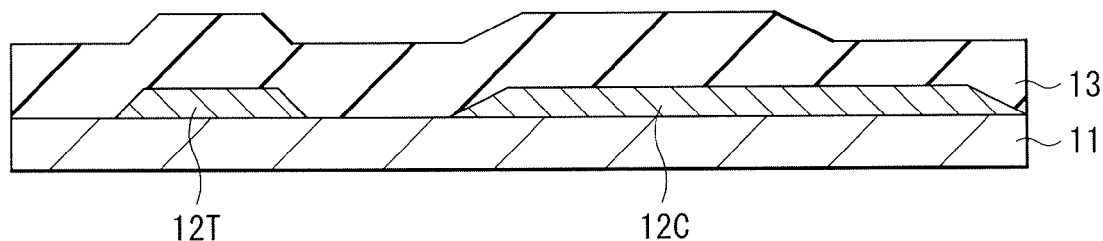
FIG. 4B is a cross-sectional view illustrating a process following FIG. 4A.

Then, as illustrated in FIG. 4B, for example, by using a plasma CVD method, the first insulating film 13 including a laminated film of a silicon nitride film and a silicon oxide film is formed over an entire surface of the substrate 11 on which the gate electrode 12T and the first conductive film 12C are provided. In the formation of the first insulating film 13 through the plasma CVD method, the silicon nitride film may be formed, for example, by using a gas such as silane, ammonia (NH$_3$), and nitrogen (N$_2$) as a material gas, and the silicon oxide film may be formed, for example, by using a gas including silane and dinitrogen monoxide as a material gas. Alternatively, in place of the plasma CVD method, the first insulating film 13 including one of a silicon nitride film, a silicon oxide film, an aluminum oxide film, and an aluminum nitride film may be formed by using the sputtering method. For the sputtering, the silicon oxide film or the silicon nitride film may be formed through reactive plasma sputtering in which silicon is used as a target, and oxygen, vapor, or nitrogen is caused to flow in a discharge atmosphere of the sputtering.

Figure 4C:
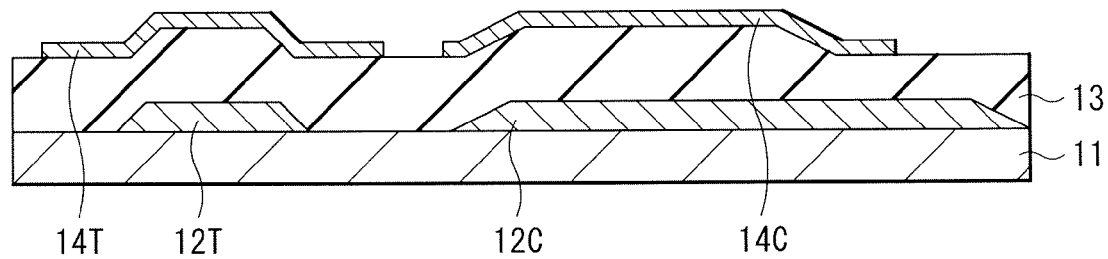
FIG. 4C is a cross-sectional view illustrating a process following FIG. 4B.

As illustrated in FIG. 4C, after the first insulating film 13 is formed, an oxide semiconductor material may be formed on the first insulating film 13 using the sputtering method, and the thus-formed oxide semiconductor material is patterned to form the channel film 14T and the semiconductor film 14C, for example. In the case where indium gallium zinc oxide is used for the oxide semiconductor material, a DC (Direct Current) sputtering method may be used in which a ceramic of an indium gallium zinc oxide is used as a target, and a plasma discharge may be performed using a mixed gas of argon (Ar) and oxygen (O$_2$). The introduction of argon and oxygen gas may be performed after air is so exhausted that a degree of vacuum in a vacuum vessel becomes $1\times10^{-4}$ Pa or less before the plasma discharge.

In the case where zinc oxide is used for the oxide semiconductor material, an RF (Radio Frequency) sputtering method may be performed in which a ceramic of a zinc oxide is used as a target. Alternatively, a sputtering method that uses a DC power supply may be performed under a gas atmosphere containing argon and oxygen using a zinc metal as a target.

At this time, carrier concentration in the channel film 14T and the semiconductor film 14C which eventually serve as a channel may be controlled by changing a flow rate of argon and oxygen during the formation of oxide.

Further, in the case where a crystalline oxide semiconductor is used for the oxide semiconductor material, a crystallization annealing process may be performed through laser application after the formation of the oxide semiconductor material, for example. Examples of the crystalline material may include zinc oxide, indium, gallium, zirconium, and tin, and an oxide semiconductor in which a ratio of indium or tin therein is higher than those of others may be used.

Figure 4D:
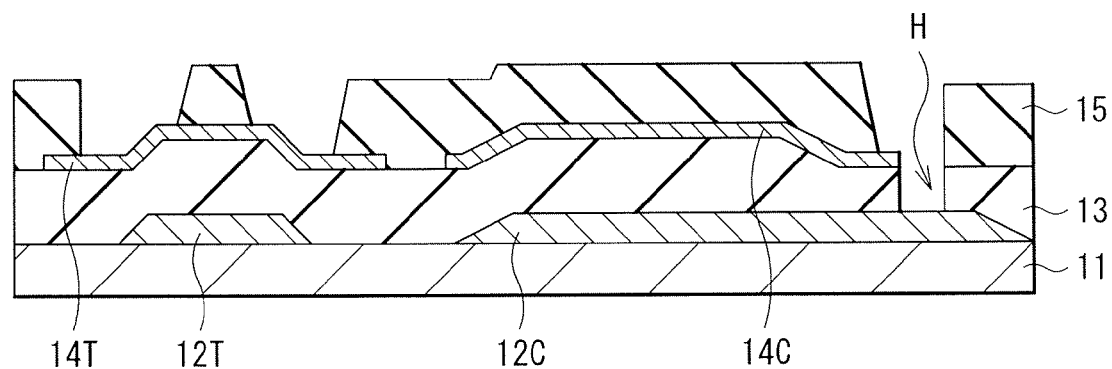
FIG. 4D is a cross-sectional view illustrating a process following FIG. 4C.

After the channel film 14T and the semiconductor film 14C are provided, an insulating film such as a silicon oxide film or a silicon nitride film is formed over the entire surface of the substrate 11. The insulating film is patterned by using the photolithography method and the etching method to form the second insulating film 15 (FIG. 4D). In the patterning of the insulating film, openings are provided at connection regions between the channel film 14T and the source-drain electrodes 16A and 16B and at a connection region between the semiconductor film 14C and the wiring 16C. At the same time as the patterning or after the second insulating film 15 is provided, a connection hole H that reaches the first conductive film 12C is formed on the first insulating film 13.

After the connection hole H is provided on the first insulating film 13, a metal film is formed over the entire surface of the substrate 11, for example, by using the sputtering method. The metal film is patterned by using the etching method to form the source-drain electrodes 16A and 16B, the wiring 16C, and the second conductive film 17. In this manner, the source-drain electrodes 16A and 16B, the wiring 16C, and the second conductive film 17 are formed by the same metal film, making it possible to reduce the number of manufacturing processes. Thereby, fabrication of the semiconductor device 10 (the transistor 10T and the capacitor 10C) illustrated in FIG. 1 is completed. In this manner, after the pixel drive circuit 140 including the semiconductor device 10 is provided, a display layer is formed to manufacture the display unit 1.

In the display unit 1, a scanning signal is supplied to each of the pixels 100 from the scanning line drive circuit 130 via the gate electrode of the writing transistor Tr2. Further, an image signal is held in the capacitor 10C from the signal line drive circuit 120 via the writing transistor Tr2. That is, in accordance with the signal held in the capacitor 10C, the driving transistor Tr1 is on-off controlled, and thereby a drive current is supplied into the pixel 100. In the transistors Tr1 and Tr2 (transistor 10T), when a voltage (gate voltage) equal to or higher than a threshold voltage is applied to the gate electrode 12T, a current (drain current) is generated in the channel region of the channel film 14T between the source-drain electrodes 16A and 16B, and the drive is performed as described above.

Here, since the first conductive film 12C of the capacitor 10C is electrically connected to the semiconductor film 14C thereof, electrical conductivity of the semiconductor film 14 is maintained in a stable manner, the detail of which is described in the following.

Figure 5:
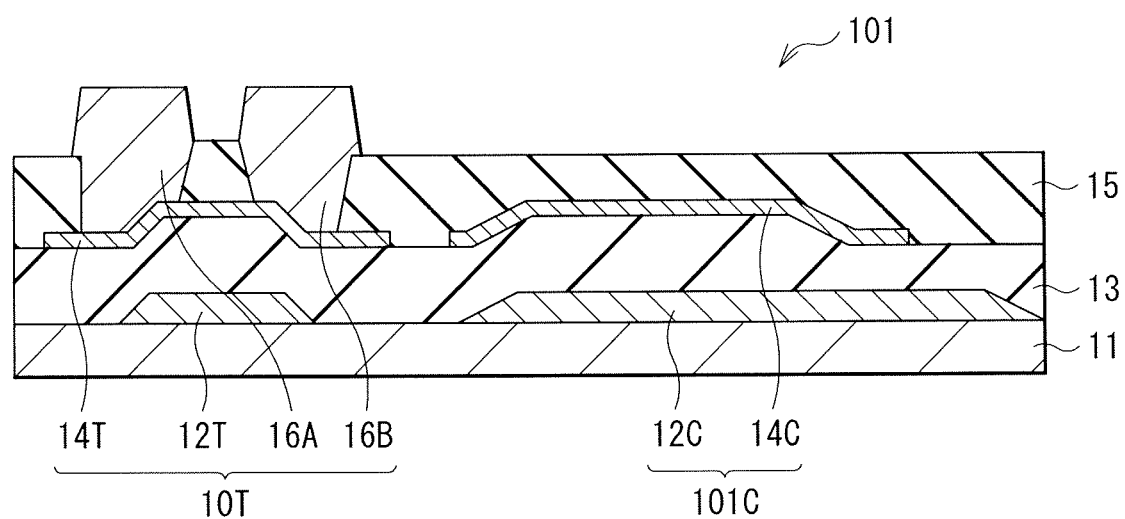
FIG. 5 is a cross-sectional view illustrating a configuration of a semiconductor device according to a comparative example.

FIG. 5 illustrates a cross-sectional configuration of a semiconductor device (semiconductor device 101) according to a comparative example. In a capacitor 101C of the semiconductor device 101, the semiconductor film 14C is not electrically connected to the first conductive film 12C, and the semiconductor film 14C and the first conductive film 12C function as a pair of electrodes.

Figure 6A:
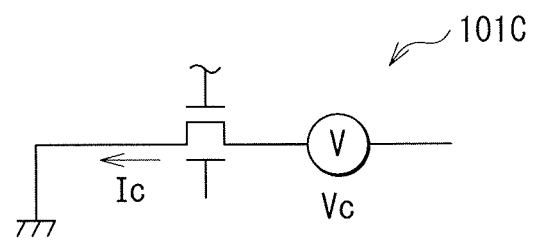
FIG. 6A schematically illustrates a state of a capacitor illustrated in FIG. 5.
Figure 6B:
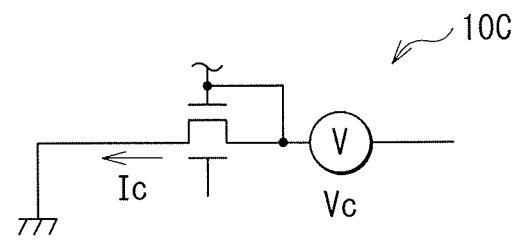
FIG. 6B schematically illustrates a state of a capacitor illustrated in FIG. 1.
Figure 7A:
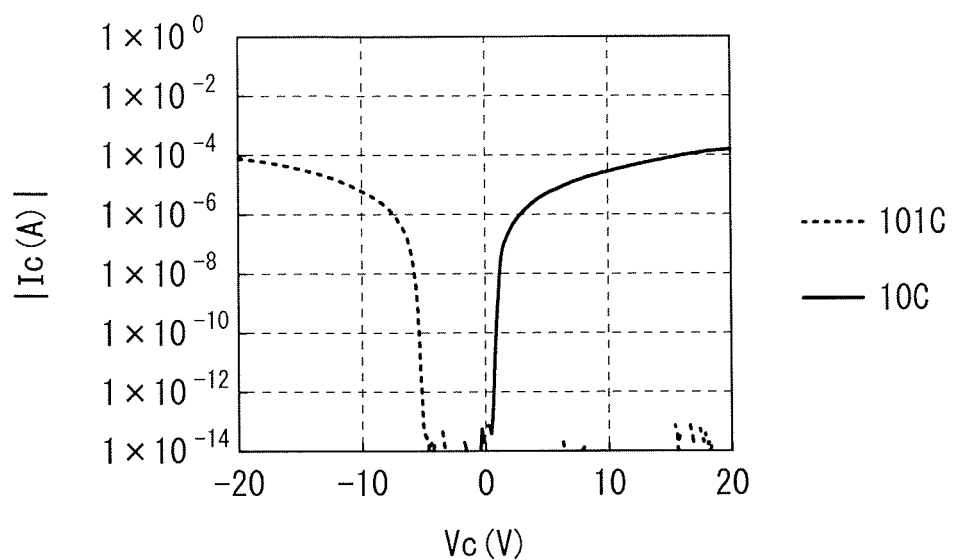
FIG. 7A illustrates IV characteristics of the capacitors illustrated in FIGS. 1 and 5.
Figure 7B:
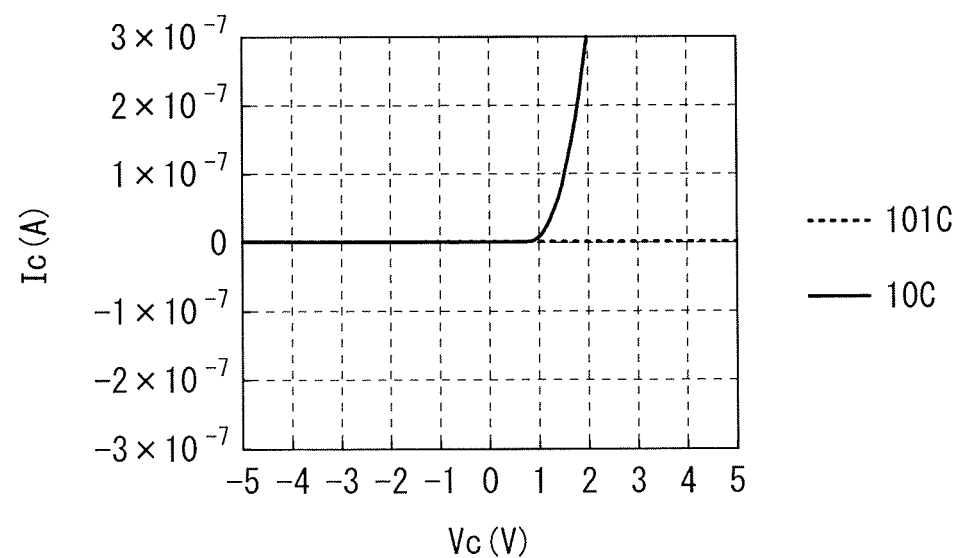
FIG. 7B illustrates the vicinity of 0V of the IV characteristics illustrated in FIG. 7A.

FIG. 6A schematically illustrates a circuit configuration of the capacitor 101C, and FIG. 6B schematically illustrates a circuit configuration of the capacitor 10C. FIGS. 7A and 7B illustrate IV characteristics of an applied voltage and a current that flows through the semiconductor film 14C configuring each of the above-described capacitors 10C and 101C. FIG. 7A illustrates an absolute value of a current Ic flowing at the time of applying a control voltage Vc to each of the capacitors 10C and 101C. The current Ic flows when the positive control voltage Vc is applied to the capacitor 10C or the negative control voltage Vc is applied to the capacitor 101C. In the capacitor 101C, since the semiconductor film 14C is not electrically connected to the conductive film, carriers in the semiconductor film 14C are more susceptible to peripheral potentials. Accordingly, the control voltage Vc at the time when a current starts to flow through the capacitor 101C is large in variation and is away from 0 (zero) V (FIG. 7A).

On the other hand, in the capacitor 10C, since the first conductive film 12C is electrically connected to the semiconductor film 14C, the carrier generation amount in the semiconductor film 14C is controlled and carriers are generated in a stable state. Thereby, the semiconductor film 14C and the first conductive film 12C each show Schottky characteristics, and the current Ic flows through the capacitor 10C from the vicinity of 0 (zero) V (FIG. 7B) in a stable manner. Such electrical conductivity of the semiconductor film 14C is maintained even when various processes are performed in the manufacturing process of the semiconductor device 1.

Figure 8A:
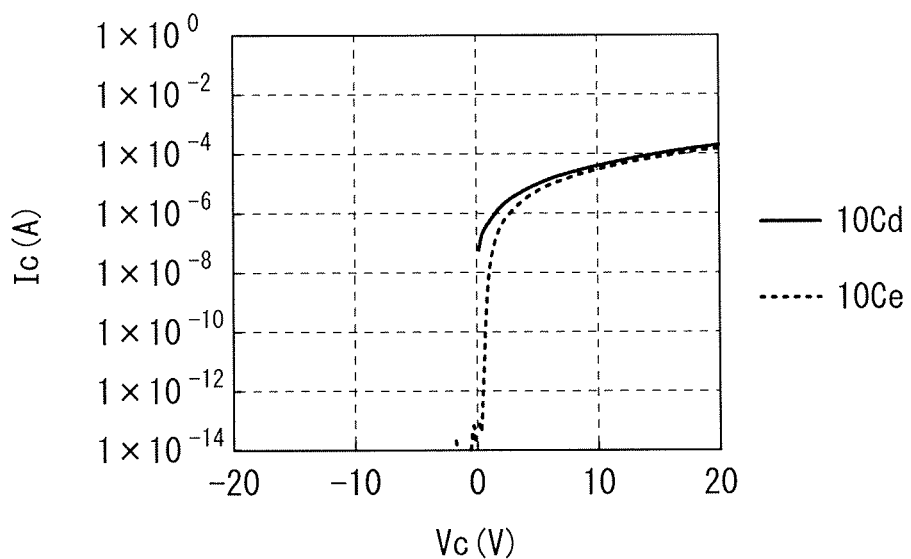
FIG. 8A illustrates the IV characteristics in the case where a semiconductor film illustrated in FIG. 1 indicates depletion characteristics.
Figure 8B:
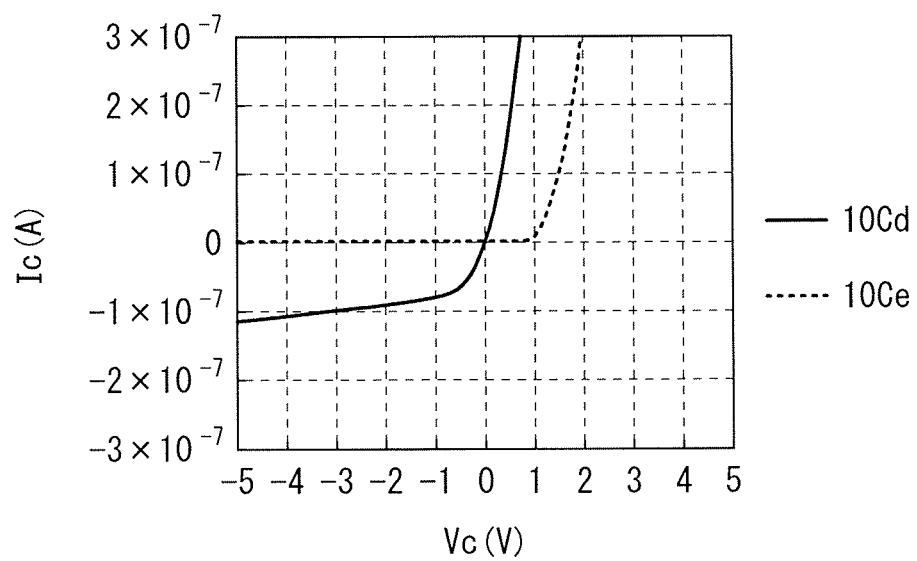
FIG. 8B illustrates the vicinity of 0V of the IV characteristics illustrated in FIG. 8A.

The semiconductor film 14C of the capacitor 10C may be used as a conductor. As illustrated in FIGS. 8A and 8B, in a capacitor 10Cd that shows depletion characteristics, the current Ic flows also when the negative control voltage Vc is applied to the capacitor 10Cd, i.e., shows constant conductivity. Solid lines in FIGS. 8A and 8B indicate the capacitor 10Cd that shows the depletion characteristics, and broken lines in FIGS. 8A and 8B indicate a capacitor Ce in an enhanced mode.

Also, in the capacitor 10C, the insulating film (second insulating film) different from the gate insulating film (first insulating film 13) of the transistor 10T is used as the capacitor insulating film. Therefore, it is possible to improve a holding capacitance.

Figure 9:
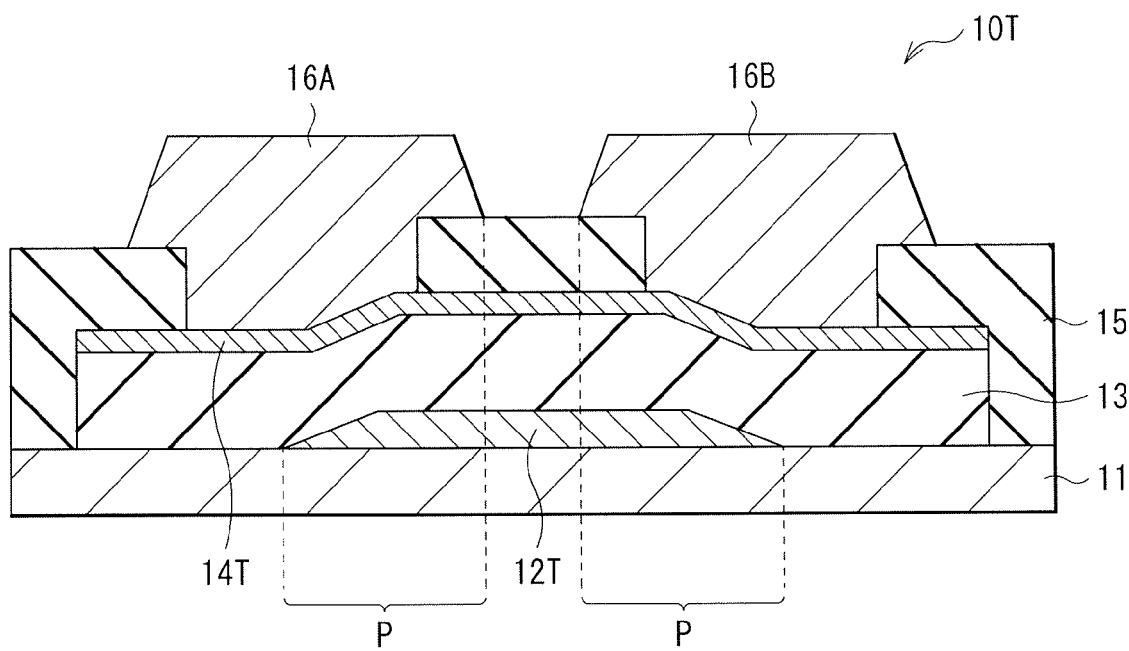
FIG. 9 is a cross-sectional view for describing a parasitic capacitance of a transistor illustrated in FIG. 1.

Since a channel protective film (second insulating film 15) is provided in the transistor 10T, a region (region P) in which the gate electrode 12T and the source-drain electrodes 16A and 16B are overlapped with each other in a plan view is large (FIG. 9). This is for the purpose of securing margins in consideration of displacement of each of the channel protective film and the source-drain electrodes 16A and 16B with respect to the gate electrode 12T at the time of formation of the transistor T10. Such an increase in region P may increase a parasitic capacitance of the transistor 10T.

In the capacitor 101C (FIG. 5), the first insulating film 13 that is same as the gate insulating film of the transistor 10T is used as the capacitor insulating film. In contrast, in the capacitor 10C, a material suitable for improving the holding capacitance is selectable for the second insulating film 15. For example, by increasing dielectric constant of the insulating material used for the second insulating film 15, the holding capacitance of the capacitor 10C is increased. Alternatively, a film thickness of the second insulating film 15 may be reduced. In the semiconductor device 10, it is possible to increase the holding capacitance in the device as a whole even when the parasitic capacitance of the transistor 10T is increased, thereby making it possible to improve correction accuracy.

As described above, in the semiconductor device 10 of the present embodiment, the first conductive film 12C is electrically connected to the semiconductor film 14C. Therefore, it is possible to maintain the electrical conductivity of the semiconductor film 14C in a stable manner.

Further, an insulating film different from the gate insulating film of the transistor 10T is selectable as the capacitor insulating film (second insulating film 15). Therefore, it is possible to improve the holding capacitance of the capacitor 10C.

Hereinafter, some other embodiments are described. In the following description, the same elements as those of the embodiment described above are denoted with the same reference numeral, and the description thereon will be omitted where appropriate.

Second Embodiment

Figure 10:
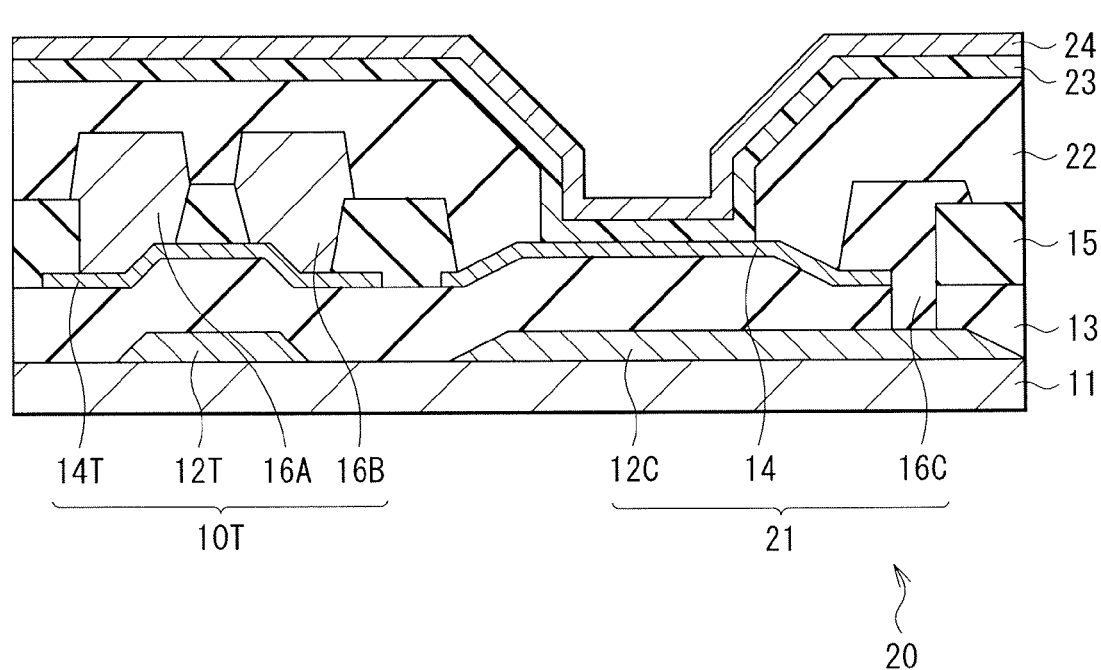
FIG. 10 is a cross-sectional view illustrating a configuration of a major part of the display unit according to a second embodiment of the present application.

FIG. 10 illustrates a cross-sectional configuration of a display unit (display unit 2) according to a second embodiment of the present application. The display unit 2 differs from the semiconductor device 10 of the first embodiment in that, in the display unit 2, the first conductive film 12C and the semiconductor film 14C are used as an anode (first electrode 21) of the organic EL element.

The display unit 2 may be, for example, a top-emission type organic EL display unit, and the organic EL element 20 is arranged at a position adjacent to the transistor 10T. The organic EL element 20 has the first electrode 21, a partition wall 22, an organic layer 23, and a second electrode 24 in this order from the substrate 11 side.

The first electrode 21 may be provided, for example, for each of the pixels 100 (FIG. 2), and the plurality of first electrodes 21 are arranged away from each other on the substrate 11. FIG. 10 illustrates the organic EL element 20 corresponding to one of the pixels 100. In the present embodiment, since the first conductive film 12C is electrically connected to the semiconductor film 14C, electrical conductivity of the semiconductor film 14C is maintained in a stable manner. Thereby, as described above, it is possible to use the semiconductor film 14C and the first conductive film 12C as the first electrode 21. As described in the first embodiment, for example, the first conductive film 12C may be provided in the same layer as the gate electrode 12T of the transistor 10T, and the semiconductor film 14C may be provided in the same layer as the channel film 14T thereof, and the first conductive film 12C and the semiconductor film 14C are connected through the wiring 16C.

The first electrode 21 has a function as a reflective layer in addition to its function as an anode. That is, the first electrode 21 may be preferably made of a material having a high reflectance and a high hole injection property. The first electrode 21 having a function as a reflective layer may be configured by using a metal film having high light reflectivity, which may be made of silver (Ag) or aluminum (Al) or an alloy thereof, for the first conductive film 12C, and by using a material having high light permeability for the semiconductor film 14C and the insulating film 13. Further, since a region that is in contact with the organic layer 23 of the first electrode 21 is the semiconductor film 14C, a contact between the organic layer 23 and the first electrode 21 is improved.

The partition wall 22 on the semiconductor film 14C is provided with an opening for defining a light-emitting region of each of the organic EL elements 20. The partition wall 22 serves to accurately control the light-emitting region to a desired shape, and secure insulation between the first electrode 21 and the second electrode 24 and between the adjacent organic EL elements 20. For the partition wall 22, an inorganic material such as silicon oxide, silicon nitride, silicon oxynitride, or aluminum oxide may be used. A plurality of insulating materials may be laminated to configure the partition wall 22. Alternatively, imide-based or novolac-based organic resin material may be used for the partition wall 22. A thickness of the partition wall 22 may be, for example, in a range from 50 nm to 2500 nm.

The organic layer 23 may have a hole injection layer, a hole transport layer, a luminescent layer, an electron transport layer, and an electron injection layer (neither of the layers are illustrated) in this order from the first electrode 21 side. The organic layer 23 may be provided common to all of the organic EL elements 20, or the organic layer 23 may be provided for each of the organic EL elements 20.

The second electrode 24 pairs with the first electrode 21 with the organic layer 23 interposed therebetween. The second electrode 24 may be provided, for example, for all of the organic EL elements 20 in common, and has a function as a semi-transparent reflective layer. Specifically, as the second electrode 24, an alloy of aluminum (Al), magnesium (Mg), calcium (Ca), or sodium (Na) may be used. In the above alloys, an alloy of magnesium and silver (Mg—Ag alloy) is preferable in that electrical conductivity in a thin film and small amount of light absorption are both achieved. A ratio of magnesium and silver in the Mg—Ag alloy is not particularly limited; however, may be preferably in a range of Mg:Ag=from 20:1 to 1:1 in film thickness ratio. Further, a material of the second electrode 17 may be an alloy of aluminum (Al) and lithium (Li) (Al—Li alloy).

As described above, the first conductive film 12C and the second electrode 24 are provided with a function as the reflective layer and a function as the semi-transparent reflective layer, respectively. As a result, the organic EL element 20 resonates light generated at the luminescent layer of the organic layer 23. In detail, a front surface of the reflective layer of the first electrode 21 serving as a first end and a back surface of the semi-transparent reflective layer of the second electrode 24 serving as a second end cause the light to resonate therebetween. The resonance structure causes multiple interferences of light and functions as a type of narrow-band filter. That is, a half band width of a spectrum of the taken-out light is reduced and color purity is improved.

An optical distance L between the first end and the second end may preferably satisfy Expression 1 to be hereinafter described. This makes it possible to match a resonance wavelength (peak wavelength of a spectrum of the taken-out light) with a peak wavelength of a spectrum of light desired to be taken out. In practice, the optical distance L may be preferably selected so as to be equal to a positive minimum that satisfies the following Expression 1.

$$(2L)/\lambda + \Phi/(2\pi) = m \qquad \text{Expression 1}$$

where L represents the optical distance between the first end and the second end, $\Phi$ represents a sum ($\Phi = \Phi 1 + \Phi 2$) (rad) of a phase shift $\Phi 1$ of reflected light generated at the first end and a phase shift $\Phi 2$ of reflected light generated at the second end, $\lambda$ represents a peak wavelength of a spectrum of light desired to be taken out from the second end (second electrode 24) side, and m represents an integer by which L becomes positive. In addition, in the Expression 1, units of L and $\lambda$ may be the same, which may be in (nm), for example.

In the display unit 2, the reflective layer of the first electrode 21 is configured by the first conductive film 12C that is separated away from the semiconductor film 14C. Therefore, a thickness of the first insulating film 13 between the semiconductor film 14C and the first conductive film 12C may be controlled to easily adjust the optical distance L. The first insulating film 13 may also be preferably light-permeable together with the semiconductor film 14C. Permeability of each of the semiconductor film 14C and the first insulating film 13 to light generated in the organic layer 2 may be preferably 50% or higher.

The second electrode 24 may be covered, for example, with a protective film made of silicon nitride (SiNx) or silicon oxide (not illustrated). A counter substrate is arranged on the protective film through an adhesion layer (not illustrated), and the light is taken out from the counter substrate side.

The above display unit 2 may be manufactured, for example, as follows.

Figure 11A:
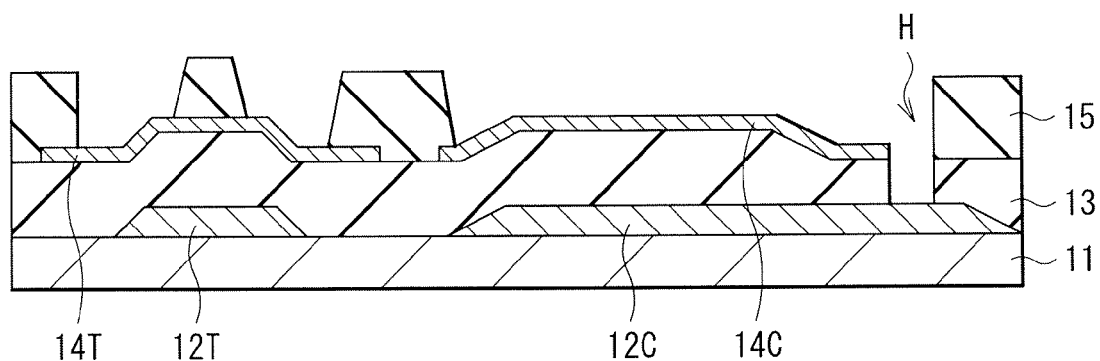
FIG. 11A is a cross-sectional view illustrating a manufacturing process of the display unit illustrated in FIG. 10.

First, after the layers up to the channel film 14T and the semiconductor film 14C are provided on the substrate 11 in the same manner as the semiconductor device 10, the second insulating film 15 is formed (FIG. 11A). In the formation process of the second insulating film 15, openings are provided on the connection region between the channel film 14T and the source-drain electrodes 16A and 16B, the connection region between the semiconductor film 14C and the wiring 16C, and the connection region between the semiconductor film 14C and the organic layer 23. At the same time as the patterning or after providing the second insulating film 15, the connection hole H that reaches the first conductive film 12C is formed on the first insulating film 13.

Figure 11B:
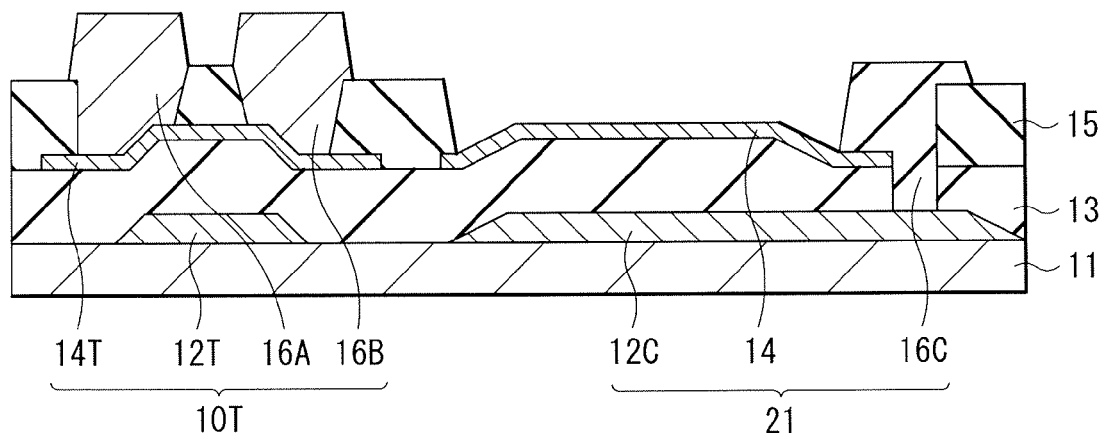
FIG. 11B is a cross-sectional view illustrating a process following FIG. 11A.

Subsequently, a metal film is formed over the entire surface of the substrate 11, for example, by the sputtering method. The metal film is patterned using the etching method to form the source-drain electrodes 16A and 16b and the wiring 16C (FIG. 11B). Thereafter, the partition wall 22, the organic layer 23, the second electrode 24, and the protective film are provided in this order, following which the counter substrate is bonded to the substrate 11 through the adhesion layer to thereby complete the display unit 2.

As described in the first embodiment, providing the channel protective film (second insulating film 15) makes it possible to prevent a damage of the channel film 14T during the formation of the source-drain electrodes 16A and 16B. However, this increases the number of processes for providing the channel protective film, including the film formation process, the exposure process, and the etching process of the insulating film.

In the display unit 2, the gate electrode 12T and the first conductive film 12C are allowed to be formed in the same process, and the channel film 14T and the semiconductor film 14C are allowed to be formed in the same process. That is, it is possible to form the first electrode 21 together with the transistor 10T to reduce the number of processes. Further, in the case where the organic EL element is provided on the transistor, a planarizing layer is necessary between the transistor and the organic EL element. In the display unit 2, the transistor 10T and the organic EL element 20 are arranged at positions adjacent to each other, making it also possible to eliminate the process of forming the planarizing layer. Therefore, it is possible to perform manufacturing at low cost.

(Module)

Figure 12:
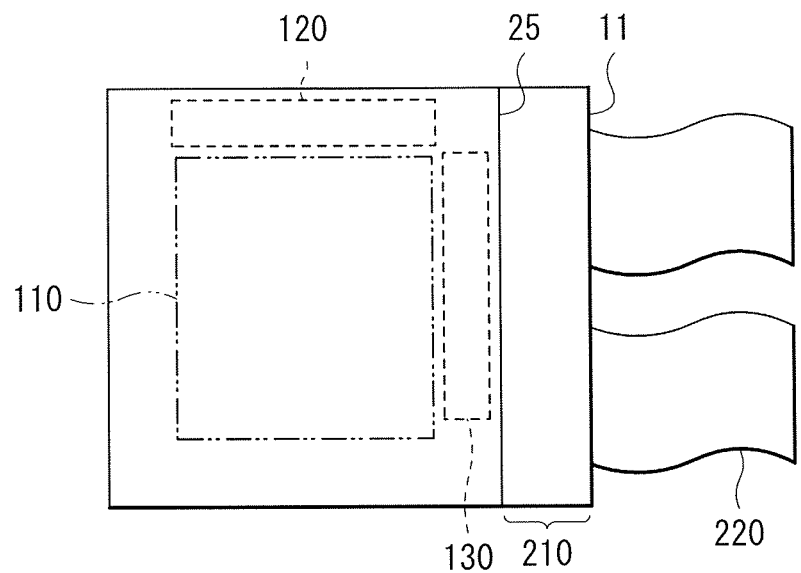
FIG. 12 is a plan view illustrating an outline configuration of a module including any of the display units illustrated in FIG. 1 etc.

As a module as illustrated in FIG. 12, for example, the display unit 1 or 2 according to any the embodiments described above may be integrated into various sorts of electronic apparatus, such as those according to application examples 1 to 5 to be hereinafter described. In the module, for example, a region 210 exposed from the counter substrate 25 may be provided on one side of the substrate 11. Further, wirings of the signal line drive circuit 120 and the scanning line drive circuit 130 may extend to the exposed region 210 to form an external connection terminal (not illustrated). The external connection terminal may be provided with FPC (Flexible Printed Circuit) 220 for inputting and outputting signals.

Application Example 1

Figure 13:
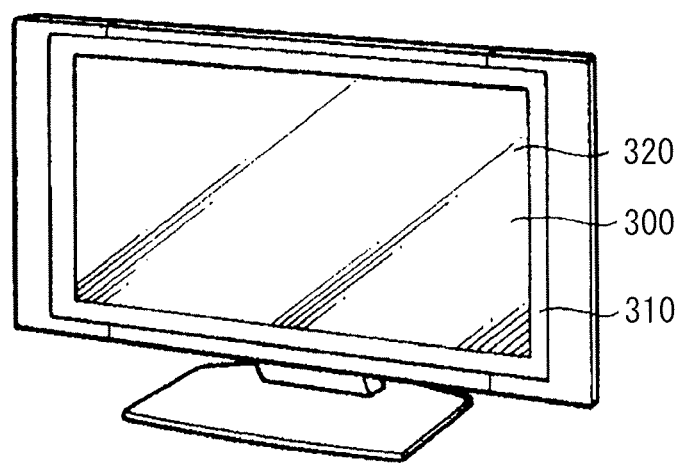
FIG. 13 is a perspective view illustrating an appearance of application example 1.

FIG. 13 illustrates an appearance of a television set to which the display unit 1 or 2 according to any of the embodiments described above is applied. The television set may have, for example, a picture display screen section 300 including a front panel 310 and a filter glass 320, and the picture display screen section 300 includes the display unit 1 or 2 according to any of the embodiments described above.

Application Example 2

Figure 14A:
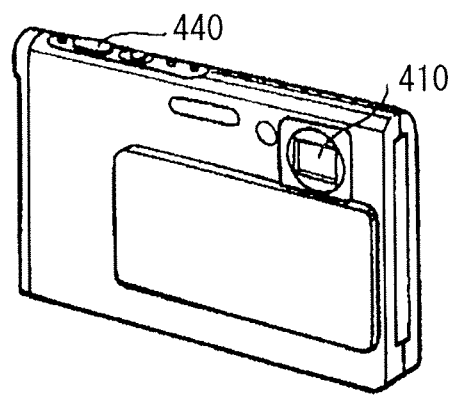
FIG. 14A is a perspective view illustrating an appearance as viewed from a front side of application example 2.
Figure 14B:
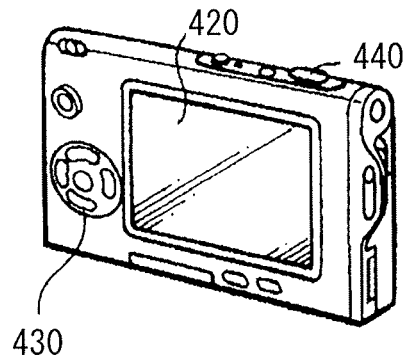
FIG. 14B is a perspective view illustrating an appearance as viewed from a rear side of the application example 2.

FIGS. 14A and 14B each illustrate an appearance of a digital camera to which the display unit 1 or 2 according to any of the embodiments described above is applied. The digital camera may have, for example, a flash light emitting section 410, a display section 420, a menu switch 430, and a shutter button 440, and the display section 420 includes the display unit 1 or 2 according to any of the embodiments described above.

Application Example 3

Figure 15:
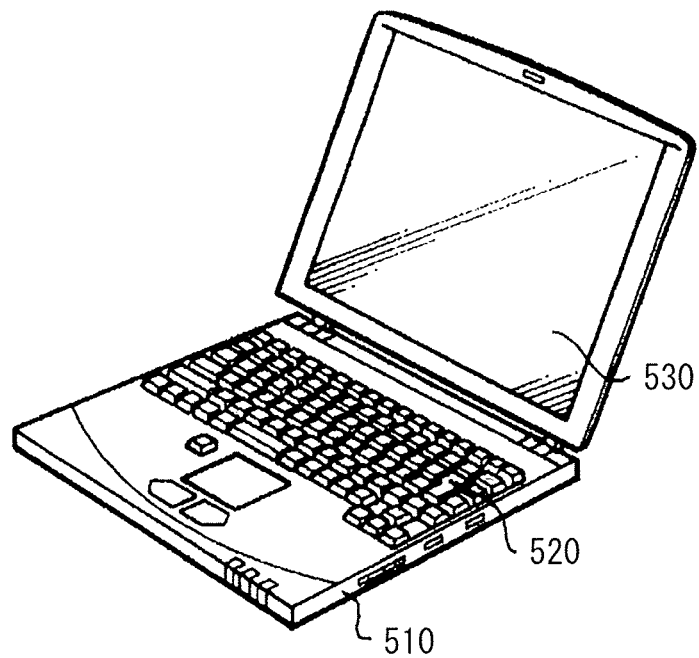
FIG. 15 is a perspective view illustrating an appearance of application example 3.

FIG. 15 illustrates an appearance of a notebook personal computer to which the display unit 1 or 2 according to any of the embodiments described above is applied. The notebook personal computer may have, for example, a main body 510, a keyboard 520 for an input operation of characters etc., and a display section 530 that displays an image, and the display section 530 includes the display unit 1 or 2 according to any of the embodiments described above.

Application Example 4

Figure 16:
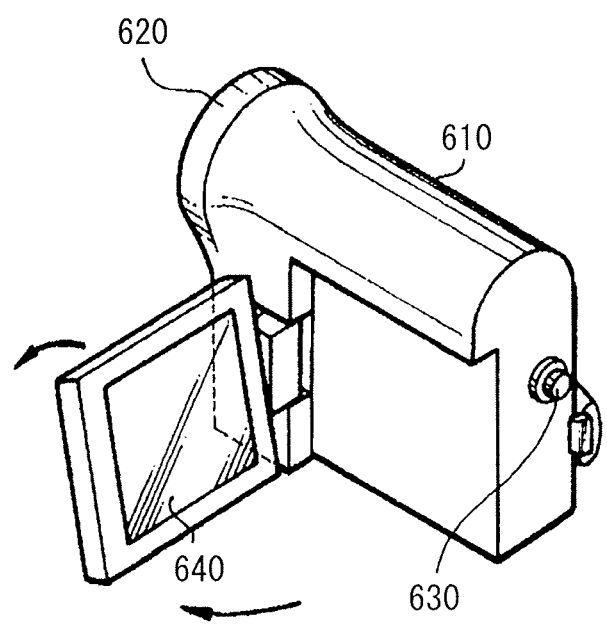
FIG. 16 is a perspective view illustrating an appearance of application example 4.

FIG. 16 illustrates an appearance of a video camera to which the display unit 1 or 2 according to any of the embodiments described above is applied. The video camera may have, for example, a main body section 610, a lens 620 for shooting an object provided on a front side face of the main body section 610, a start/stop switch 630 upon shooting, and a display section 640. The display section 640 includes the display unit 1 or 2 according to any of the embodiments described above.

Application Example 5

Figure 17A:
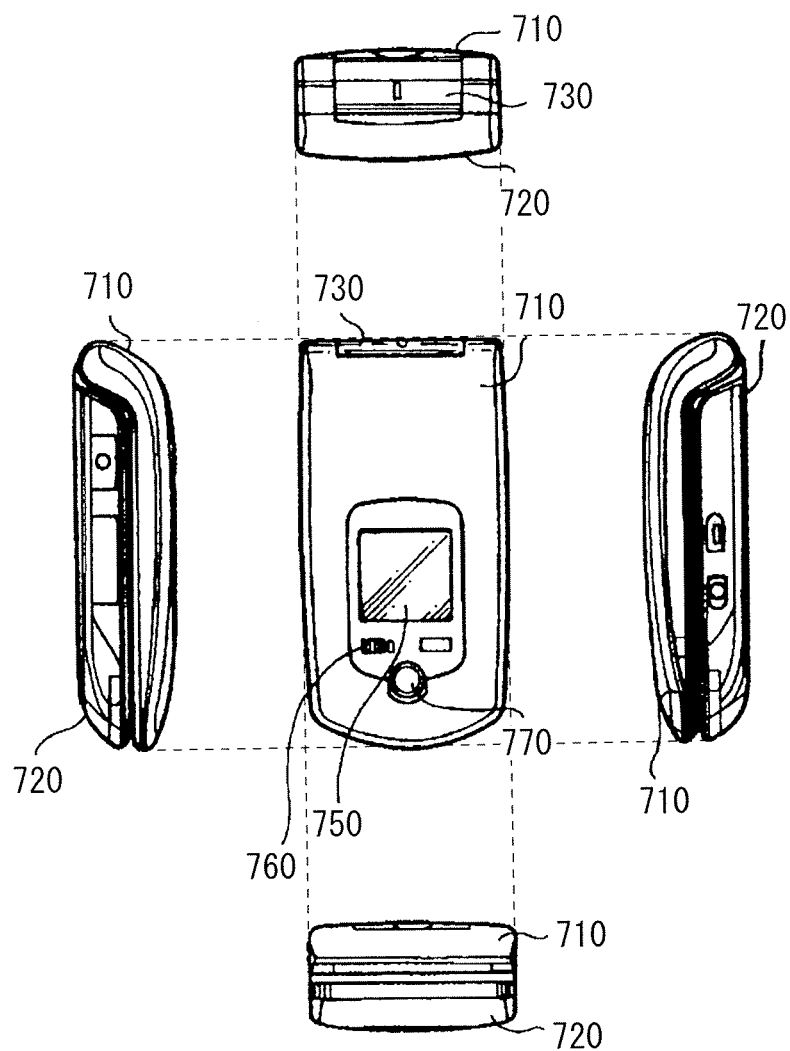
FIG. 17A illustrates a closed state of application example 5.
Figure 17B:
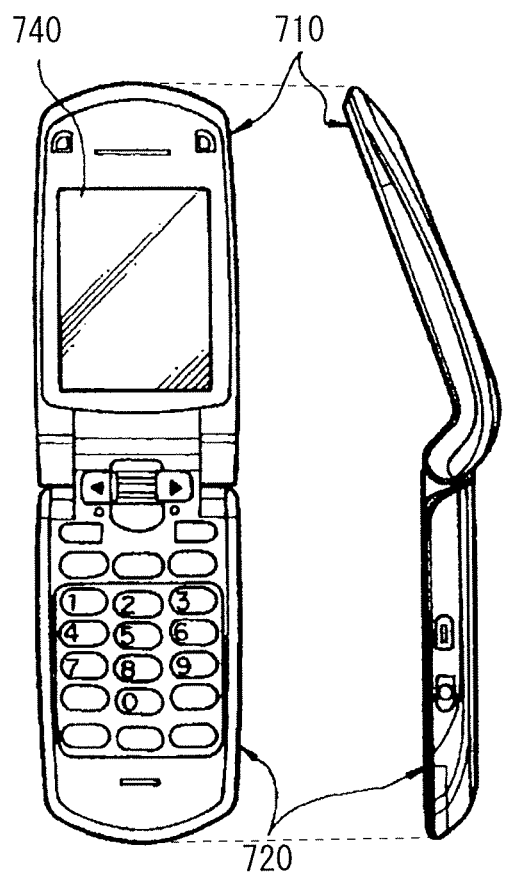
FIG. 17B illustrates an open state of the application example 5.

FIGS. 17A and 17B each illustrate an appearance of a mobile phone to which the display unit 1 or 2 according to any of the embodiments described above is applied. The mobile phone may have a configuration in which, for example, an upper body 710 and a lower body 720 are connected by a connection part (hinge) 730, and may have a display 740, a sub-display 750, a picture light 760, and a camera 770. The display 740 or the sub-display 750 includes the display unit 1 or 2 according to any of the embodiments described above.

Figure 18:
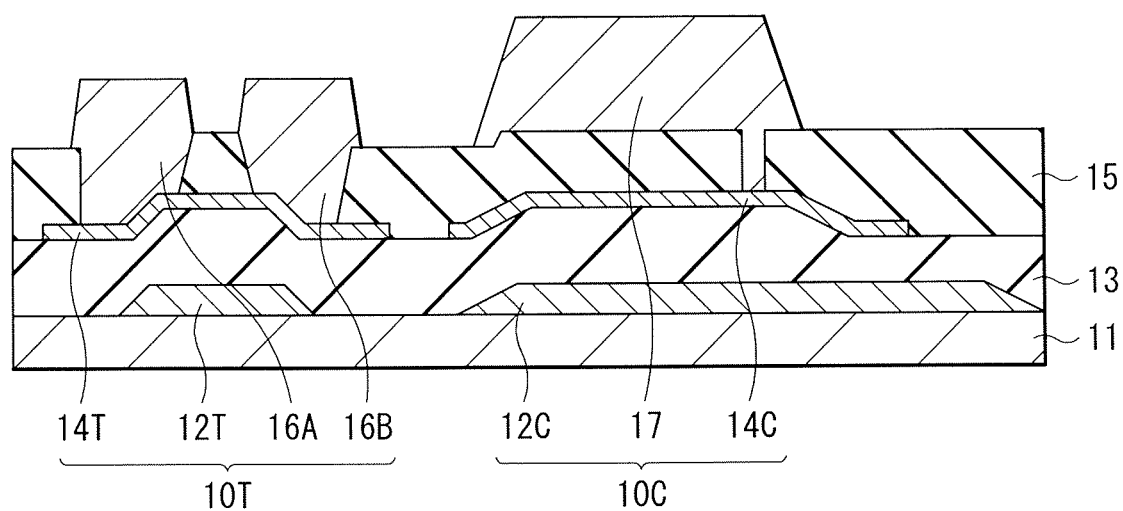
FIG. 18 is a cross-sectional view illustrating another example of the semiconductor device illustrated in FIG. 1.

As described above, the present application is described with reference to the example embodiments and the application examples. However, the present application is not limited to the embodiments etc. described above, and may be variously modified. For example, in the semiconductor device 10, a case where the semiconductor film 14C is electrically connected to the first conductive film 12C is described. However, the semiconductor film 14C may be electrically connected to the second conductive film 17 through the connection hole of the second insulating film 15 (FIG. 18).

Further, in the embodiments etc. described above, a case where the first electrode 21 serves as an anode and the second electrode 24 serves as a cathode is described. However, the anode and the cathode may be reversed, and the first electrode 21 may serve as the cathode and the second electrode 24 may serve as the anode.

Further, in the embodiments etc. described above, a case where the display layer is the organic layer including the luminescent layer is described. However, the display layer may be any other layers such as a liquid crystal layer, an inorganic layer including the luminescent layer, and an electrophoretic layer.

In addition, materials and thicknesses of respective layers, or film formation methods and film formation conditions described in the embodiments etc. described above are non-limiting. Other materials and thicknesses may be used, or other film formation methods and film formation conditions may be used.

Furthermore, the technology encompasses any possible combination of some or all of the various embodiments described herein and incorporated herein.

It is possible to achieve at least the following configurations from the above-described example embodiments of the disclosure.

(1) A semiconductor device, including:
a transistor;
an oxide semiconductor film;
a first conductive film electrically connected to the oxide semiconductor film; and
a first insulating film provided between the first conductive film and the oxide semiconductor film.

(2) The semiconductor device according to (1), further including a capacitor, wherein
the oxide semiconductor film and the first conductive film serve as a first electrode of the capacitor.

(3) The semiconductor device according to (2), wherein the capacitor includes a second electrode and a second insulating film, the second electrode facing the first conductive film with the oxide semiconductor film interposed in between, and the second insulating film being provided between the second electrode and the oxide semiconductor film.

(4) The semiconductor device according to any one of (1) to (3), wherein
the first conductive film is provided in a same layer as a gate electrode of the transistor, and the oxide semiconductor film is provided in a same layer as a channel film of the transistor, and
the first insulating film extends between the gate electrode and the channel film.

(5) The semiconductor device according to (4), wherein the gate electrode of the transistor and the first conductive film are made of a same material, and
the channel film of the transistor and the oxide semiconductor film are made of a same material.

(6) The semiconductor device according to any one of (1) to (5), wherein the first conductive film includes a metal material.

(7) The semiconductor device according to any one of (1) to (6), wherein the first conductive film has a potential that is same as a potential of the oxide semiconductor film.

(8) A display unit, including:
a display layer; and
a semiconductor device configured to drive the display layer, the semiconductor device including
a transistor,
an oxide semiconductor film,
a first conductive film electrically connected to the oxide semiconductor film, and
a first insulating film provided between the first conductive film and the oxide semiconductor film.

(9) The display unit according to (8), wherein the oxide semiconductor film and the first conductive film serve as one of a pair of electrodes that face each other with the display layer interposed in between.

(10) The display unit according to (9), wherein the display layer is an organic layer that includes a luminescent layer.

(11) The display unit according to (8), wherein
the semiconductor device includes a capacitor, and
the oxide semiconductor film and the first conductive film serve as an electrode of the capacitor.

(12) An electronic apparatus provided with a display unit, the display unit being provided with a display layer and a semiconductor device configured to drive the display layer, the semiconductor device including:
a transistor;
an oxide semiconductor film;
a first conductive film electrically connected to the oxide semiconductor film; and
a first insulating film provided between the first conductive film and the oxide semiconductor film.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device, comprising:
a transistor including a channel film; and
a capacitor that is spaced apart from the transistor, the capacitor including
a first electrode including, in order, a first conductive film, a first insulating film provided on the first conductive film, and an oxide semiconductor film provided on the insulating film, the first conductive film and the oxide semiconductor film being electrically connected by a wiring,
a second insulating film, and
a second electrode,
wherein the channel film of the transistor and the oxide semiconductor film are made of the same material.

2. The semiconductor device according to claim 1, wherein the first conductive film is provided in a same layer as a gate electrode of the transistor, and the oxide semiconductor film is provided in a same layer as a channel film of the transistor, and
the first insulating film extends between the gate electrode and the channel film.

3. The semiconductor device according to claim 2, wherein the gate electrode of the transistor and the first conductive film are made of a same material.

4. The semiconductor device according to claim 1, wherein the first conductive film includes a metal material.

5. The semiconductor device according to claim 1, wherein the first conductive film has a potential that is same as a potential of the oxide semiconductor film.

6. A display unit, comprising:
a display layer; and
a semiconductor device configured to drive the display layer, the semiconductor device including
a transistor including a channel film, and
a capacitor that is spaced apart from the transistor, the capacitor including
a first electrode including, in order, a first conductive film, a first insulating film provided on the first conductive film, and an oxide semiconductor film provided on the insulating film, the first conductive film and the oxide semiconductor film being electrically connected by a wiring,
a second insulating film, and
a second electrode,
wherein the channel film of the transistor and the oxide semiconductor film are made of the same material.

7. The display unit according to claim 6, wherein the oxide semiconductor film and the first conductive film face each other with the display layer interposed in between.

8. The display unit according to claim 7, wherein the display layer is an organic layer that includes a luminescent layer.

9. The display unit according to claim 7, wherein
the semiconductor device includes a capacitor, and
the oxide semiconductor film and the first conductive film serve as an electrode of the capacitor.

10. An electronic apparatus provided with a display unit, the display unit being provided with a display layer and a semiconductor device configured to drive the display layer, the semiconductor device comprising:
a transistor including a channel film; and
a capacitor that is spaced apart from the transistor, the capacitor including
a first electrode including, in order, a first conductive film, a first insulating film provided on the first conductive film, and an oxide semiconductor film provided on the insulating film, the first conductive film and the oxide semiconductor film being electrically connected by a wiring,
a second insulating film, and
a second electrode,
wherein the channel film of the transistor and the oxide semiconductor film are made of the same material.

* * * * *